United States Patent
Parkinson

(10) Patent No.: US 6,781,860 B2
(45) Date of Patent: Aug. 24, 2004

(54) HIGH VOLTAGE ROW AND COLUMN DRIVER FOR PROGRAMMABLE RESISTANCE MEMORY

(75) Inventor: Ward Parkinson, Boise, ID (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/137,476

(22) Filed: May 1, 2002

(65) Prior Publication Data

US 2003/0206428 A1 Nov. 6, 2003

(51) Int. Cl.[7] ............................. G11C 17/00; G11C 8/00
(52) U.S. Cl. ........................... 365/100; 365/230.06
(58) Field of Search ............................. 365/100, 148, 365/158, 163, 189.09, 230.06; 326/82, 83; 327/108

(56) References Cited

U.S. PATENT DOCUMENTS

| | | | | |
|---|---|---|---|---|
| 5,646,899 A | * | 7/1997 | Jang et al. | 365/189.11 |
| 5,912,839 A | * | 6/1999 | Ovshinsky et al. | 365/163 |
| 5,933,365 A | * | 8/1999 | Klersy et al. | 365/148 |
| 6,198,650 B1 | * | 3/2001 | Suh | 365/230.06 |
| 6,252,795 B1 | * | 6/2001 | Hansen et al. | 365/158 |
| 6,307,400 B1 | * | 10/2001 | Kim et al. | 326/83 |
| 6,314,014 B1 | * | 11/2001 | Lowrey et al. | 365/100 |
| 6,480,438 B1 | * | 11/2002 | Park | 365/230.06 |
| 6,525,972 B2 | * | 2/2003 | Yanagisawa | 365/189.09 |

* cited by examiner

Primary Examiner—Trong Phan
(74) Attorney, Agent, or Firm—Philip H. Schlazer; Marvin S. Siskind

(57) ABSTRACT

A driver circuit having one or more MOS transistors. The driver circuit is capable of providing an output voltage greater than the power supply voltage; however, the magnitude of the voltages appearing across the terminals of the MOS transistors are preferably less than or equal to the magnitude of the power supply voltage. The driver circuit may comprise a plurality of serially coupled PMOS transistors and a plurality of serially coupled NMOS transistors wherein the plurality of PMOS transistors and plurality of NMOS transistors are coupled at the output node of the driver.

45 Claims, 5 Drawing Sheets

HIGH VOLTAGE ROW AND COLUMN DRIVER FOR PROGRAMMABLE RESISTANCE MEMORY

FIELD OF THE INVENTION

The present invention relates generally to peripheral circuitry for a programmable resistance memory array. More specifically, the present invention is related to driver circuitry for a programmable resistance memory array.

BACKGROUND AND PRIOR ART

Programmable resistance memory elements formed from materials that can be programmed to exhibit at least a high or low stable resistance state are known in the art. Such programmable resistance elements may be programmed to a high resistance state to store, for example, a logic ZERO data bit. As well, they may be programmed to a low resistance state to store, for example, a logic ONE data bit. Programming a programmable resistance memory element to its high and low resistance states is typically referred to as RESET and SET programming operations, respectively.

One type of material that can be used as the memory material for programmable resistance elements is phase change material. Phase change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The concept of utilizing electrically programmable phase change materials for electronic memory applications is disclosed, for example, in U.S. Pat. Nos. 3,271,591 and 3,530,441, the contents of which are incorporated herein by reference. The early phase change materials described in the '591 and '441 Patents were based on changes in local structural order. The changes in structural order were typically accompanied by atomic migration of certain species within the material. Such atomic migration between the amorphous and crystalline states made programming energies relatively high.

The electrical energy required to produce a detectable change in resistance in these materials was typically in the range of about a microjoule. This amount of energy must be delivered to each of the memory elements in the solid state matrix of rows and columns of memory cells. Such high energy requirements translate into high current carrying requirements for the address lines and for the cell isolation/address device associated with each discrete memory element.

The high energy requirements for programming the memory cells described in the '591 and '441 patents limited the use of these cells as a direct and universal replacement for present computer memory applications, such as tape, floppy disks, magnetic or optical hard disk drives, solid state disk flash, DRAM, SRAM, and socket flash memory. In particular, low programming energy is important when the EEPROMs are used for large-scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the power consumption of the mechanical systems. In the-case of lap-top computers, this is of particular interest because the mechanical hard disk drive is one of the largest power consumers therein. Therefore, it would be advantageous to reduce this power load, thereby substantially increasing the operating time of the computer per charge of the power cells. However, if the EEPROM replacement for hard drives has high programming energy requirements (and high power requirements), the power savings may be inconsequential or at best unsubstantial. Therefore, any EEPROM which is to be considered a universal memory requires low programming energy.

The programming energy requirements of a programmable resistance memory element may be reduced in different ways. For example, the programming energies may be reduced by the appropriate selection of the composition of the memory material. An example of a phase change material having reduced energy requirements is described in U.S. Pat. No. 5,166,758, the disclosure of which is incorporated by reference herein. Other examples of memory materials are provided in U.S. Pat. Nos. 5,296,716, 5,414,271, 5,359,205, and 5,534,712, the disclosures of which are all hereby incorporated by reference herein.

The programming energy requirement may also be reduced through the appropriate modification of the electrical contacts used to deliver the programming energy to the memory material. For example, reduction in programming energy may be achieved by modifying the composition and/or shape and/or configuration (positioning relative to the memory material) of the electrical contacts. Examples of such "contact modification" are provided in U.S. Pat. Nos. 5,341,328, 5,406,509, 5,534,711, 5,536,947, 5,687,112, 5,933,365, the disclosures of which are all hereby incorporated by reference herein. Examples are also provided in U.S. patent application Ser. Nos. 09/276,273, 09/620,318, 09/677,957 and 09/891,157, the disclosures of which are all hereby incorporated by reference herein. An example of circuitry for reading the state of a programmable resistance memory element is provided in U.S. Pat. No. 6,314,014, the disclosure of which is hereby incorporated by reference herein.

It is possible that currents necessary for appropriately operating a programmable resistance memory element may exceed the currents that can be provided to the memory cell at a given power supply voltage Vcc. For example, programmable resistance memory elements may need to be "formed" before achieving normal operating range for a 1 and 0. Forming may require currents which are possibly as much as two to three times that required to either RESET or SET the programmable resistance element. In addition, it is possible that the currents necessary to write to a programmable resistance memory element (such as the current needed to RESET the memory device) may also exceed the current that can be delivered to the memory chip at a given power supply voltage Vcc. (As an example, it is possible that a RESET operation may require as much as about 1.5 ma to about 3 ma while forming may be require currents which are about two or three times this amount or possibly more).

This suggests a need for a higher on-chip voltage to provide the currents necessary for programming and/or forming the programmable resistance memory elements. If the power supply voltage Vcc to the memory chip is increased to provide the necessary currents, then transistors on the memory chip, such as the transistors on the driver circuitry, may need to be designed to accommodate this higher voltage. This may increase the size and cost of the chip. Therefore, there is a need for driver circuitry, which may use conventional transistors, which will permit a column line or a row line of the memory array to be driven to a voltage above the power supply voltage Vcc.

SUMMARY OF THE INVENTION

One aspect of the invention is a memory system, comprising: a programmable resistance memory cell coupled to a column line and a row line; and a driver circuit having an output node for outputting an output voltage to the column line and/or the row line, the driver circuit comprising: a plurality of PMOS transistors coupled in series between said output node and a first node of said driver circuit, a plurality of NMOS transistors coupled is series between said output node and a second node of said driver circuit.

Another aspect of the invention is a memory system, comprising: a programmable resistance memory cell coupled to a column line and a row line; and a driver circuit having an output node for outputting an output voltage to the column line and/or the row line, the driver circuit comprising: a plurality of PMOS transistors coupled in series, a plurality of NMOS transistors coupled is series, said plurality of PMOS transistors being coupled in series with said plurality of NMOS at said output node.

Another aspect of the invention is a memory system, comprising: a programmable resistance memory cell coupled to a column line and a row line; and a driver circuit having at least one MOS transistor, said driver circuit outputting an output voltage from an output node to the column line and/or the row line, the driver circuit having a first node supplied with a first voltage and a second node supplied with a second voltage, the magnitude of said first voltage being greater than the magnitude of said second voltage, said driver circuit adapted so that said output voltage is capable of having a magnitude greater than the magnitude of said second voltage, said driver circuit further adapted so that voltages across a drain and a source of said MOS transistor, a gate and the drain of said MOS transistor, and the gate and the source of said MOS transistors have magnitudes that are less than or equal to the magnitude of said second voltage.

Another aspect of the invention is a driver circuit, comprising: at least one MOS transistor, said driver circuit outputting an output voltage from an output node, the driver circuit having a first node supplied with a first voltage and a second node supplied with a second voltage, the magnitude of said first voltage being greater than the magnitude of said second voltage, said driver circuit adapted so that said output voltage is capable of having a magnitude greater than the magnitude of said second voltage, said driver circuit further adapted so that voltages across a drain and a source of said MOS transistor, a gate and the drain of said MOS transistor, and the gate and the source of said MOS transistors have magnitudes that are less than or equal to the magnitude of said second voltage.

DETAILED DESCRIPTION OF THE INVENTION

In the following paragraphs and in association with the accompanying figures, examples of memory devices formed according to embodiments of the invention are presented. Specific embodiments of memory elements and methods of making such memory elements are described below as they might be implemented for use in semiconductor memory circuits. In the interest of clarity, not all features of an actual implementation are described in this specification.

Figure 1:
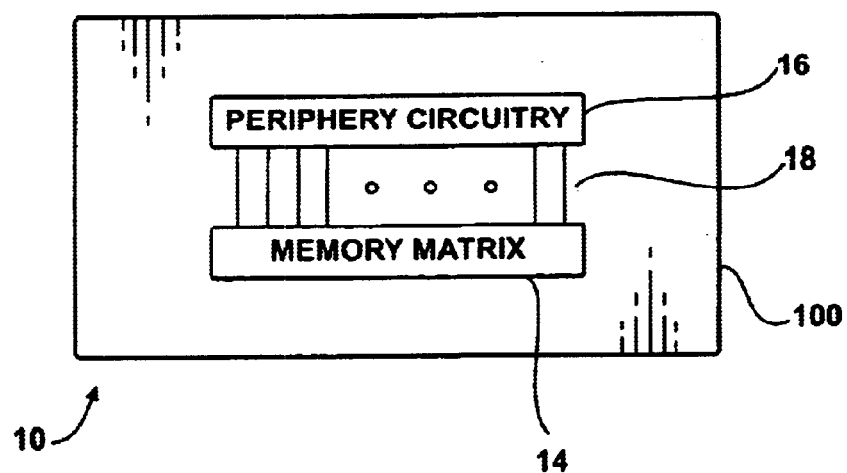
FIG. 1 shows a high-level diagram of a memory device of the present invention including a memory array and periphery circuitry formed on a substrate.

Referring to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing and driving the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2A:
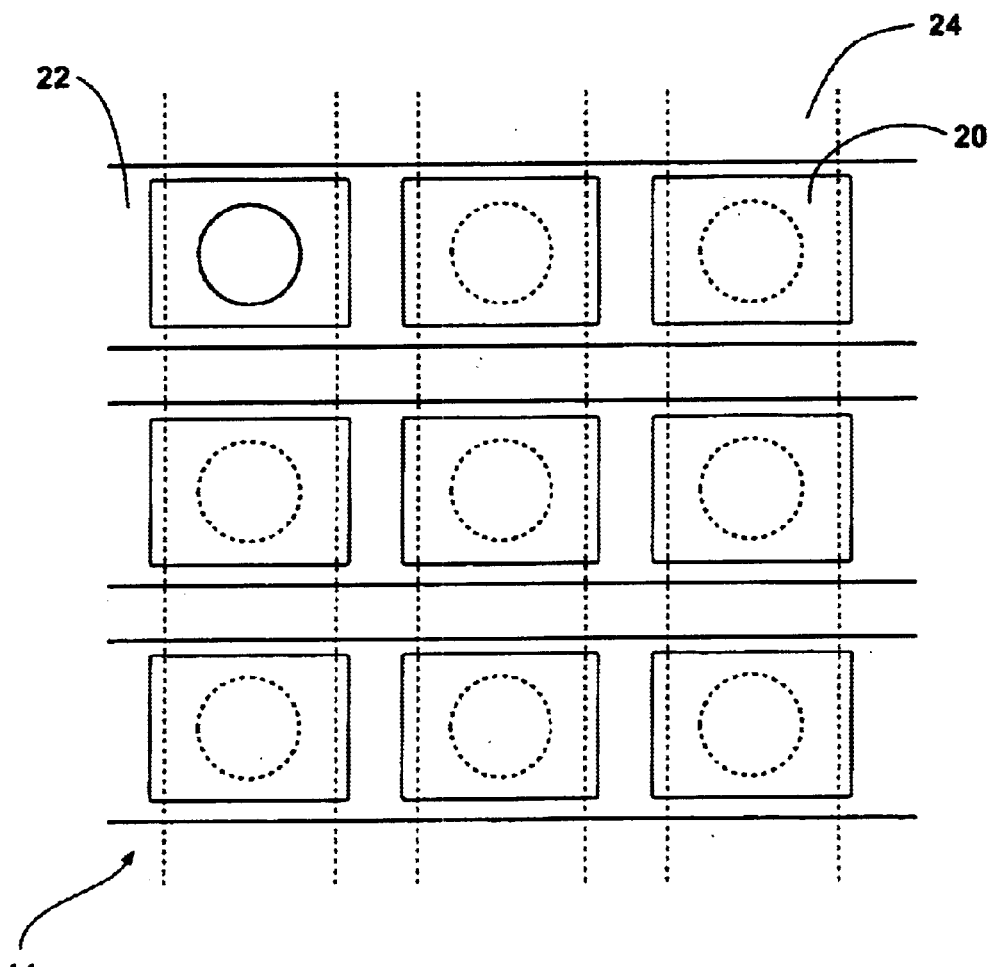
FIG. 2A shows a high-level diagram of a memory array of the present invention.

A top view of the memory array 14 is shown in FIG. 2A. As can be seen, the memory array 14 includes a plurality of memory cells 20 that are arranged in generally perpendicular rows and columns. The memory cells 20 in each row are coupled together by a respective row line 22 (also referred to as a wordline), and the memory cells 20 in each column are coupled together by a respective column line 24 (also referred to as a bitline).

Figure 2B:
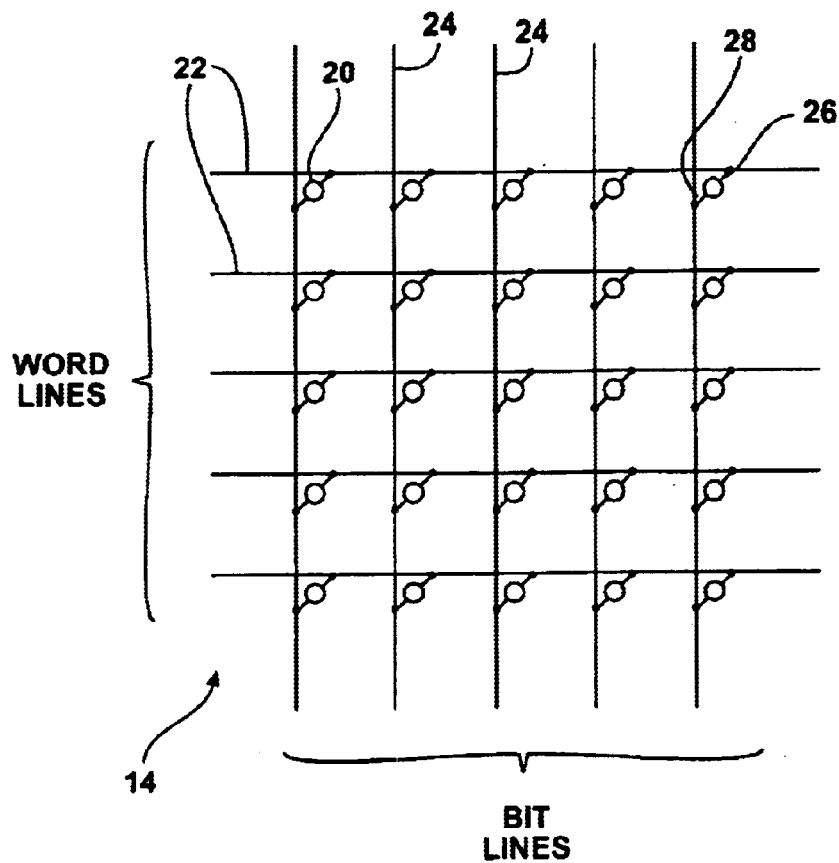
FIG. 2B is a schematic diagram of a memory array of the present invention.

A schematic diagram of the memory array 14 is shown in FIG. 2B. As can be seen, each memory cell 20 includes a row line node 26 that is coupled to a respective row line 22, and each memory cell 20 includes a column line node 28 that is coupled to a respective column line 24. The conductive row lines 22 and column lines 24 are collectively referred to as address lines. These address lines are electrically coupled to the periphery circuitry 16 (shown in FIG. 1) so that each of the memory cells 20 can be accessed for the storage and retrieval of information.

Figure 3:
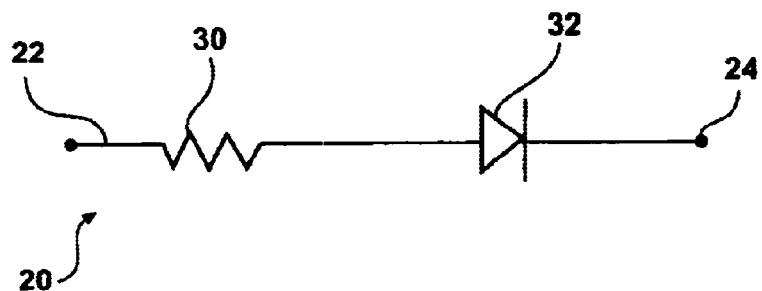
FIG. 3 is a schematic diagram of a memory cell incorporating a programmable resistance memory material.

FIG. 3 illustrates an exemplary memory cell 20 that may be used in the memory array 14. The memory cell 20 includes a memory element 30 which is coupled to an access device 32. The access device electrically isolates each memory element from all other memory elements in the array. In this embodiment, the memory element 30 is illustrated as a programmable resistive element, and the access device 32 is illustrated as a diode. It is noted that in other embodiments, it is possible that the access device be a MOS transistor or even a bipolar junction transistor (such as a PNP transistor).

The programmable resistive element comprises a programmable resistance material which is preferably a phase change material and which, more preferably, is a chalcogenide material (as will be more fully explained below). As illustrated in FIG. 3, the memory element 30 is coupled to a row line 22, and the access device 32 is coupled to a column line 24. However, it should be understood that connections of the memory element 20 may be reversed without adversely affecting the operation of the memory array 14.

Figure 4:
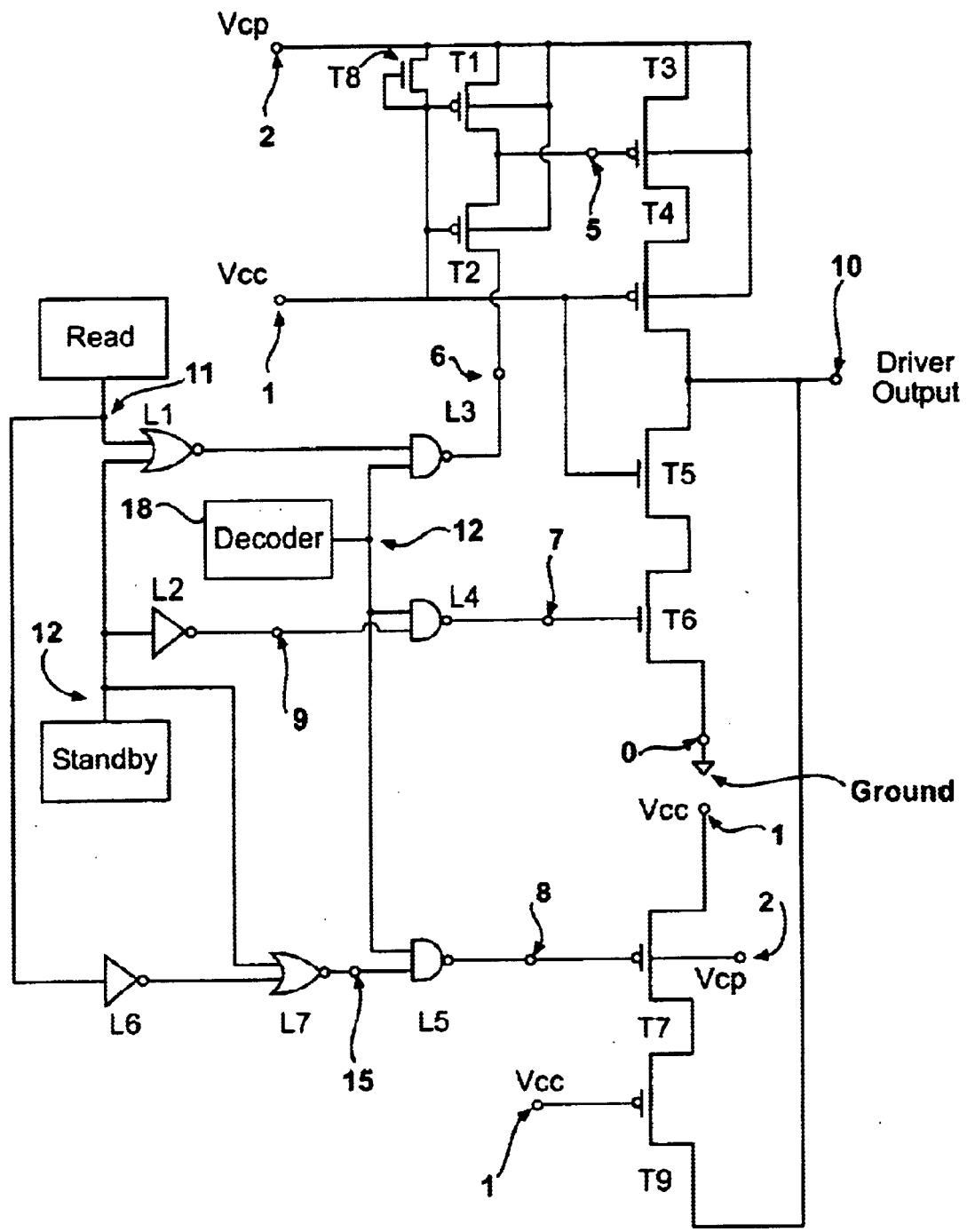
FIG. 4 is a schematic diagram of an embodiment of the driver circuit of the present invention.

FIG. 4 shows an embodiment of a driver circuit of the present invention. The driver circuit allows a column line and/or a row line of a programmable resistance memory array to be driven to a voltage which is higher than the power supply voltage Vcc. This allow a programmable resistance memory element to be programmed and/or formed if a higher voltage is required to deliver the current needed by the memory element during the programming and/or forming operation. The power supply voltage Vcc is coupled to the driver circuit at node 1 while the voltage Vcp is coupled to the driver circuit at node 2. Preferably, the magnitude (i.e., absolute value) of Vcp is greater than the magnitude of Vcc. More preferably, the magnitude of Vcp is greater than the magnitude of Vcc and also less than (or equal to) the magnitude of 2 Vcc.

Preferably, Vcc is a positive voltage relative to ground. With Vcc positive relative to ground, it is preferable that Vcp is greater (i.e. higher) than Vcc. More preferably, Vcp is greater than Vcc and also less (i.e., lower) than or equal to 2 Vcc. The column or row decoder 18 may be coupled to the driver circuit at the input node 13. In one embodiment of the invention, the power supply voltage may be about 3 volts. In this case, the value of Vcp may be about twice the power supply voltage (that is, it may be about 6 volts).

The driver circuit includes the driver output node 10 which is coupled to one or more of the column lines and/or one or more of the row lines of the programmable resistance memory array. In an alternate embodiment of the invention, the driver output node 10 may be selectively coupled to one or more column lines and/or one or more row line (see, for example, FIG. 6 where the driver output node 10 is selectively coupled to a column line or a row line through the current path of transistor T21). The driver circuitry (through the output node 10) electrically communicates with the column lines and/or row lines of the memory array to switch the column lines and/or row lines to the appropriate voltage.

The embodiment of the driver circuit shown in FIG. 4 includes PMOS transistors T1, T2, T3, T4 and T7 as well as NMOS transistors T5, T6 and T9. In the embodiment shown, the PMOS transistors T3 and T4 are coupled in series. Likewise, the NMOS transistors T5 and T6 are coupled in series. Furthermore, the pair of PMOS transistors T3 and T4 is coupled in series with the pair of NMOS transistors T5 and T6 at the driver output node 10. (Referring to FIG. 4, it is seen that the pair of PMOS transistors T3 and T4 is serially coupled to the pair of NMOS transistors T5 and T6 at the driver output node 10). It is noted that the pair of the PMOS transistors T3 and T4 do not have to be identical. Likewise, the pair of NMOS transistors T5 and T6 do not have to be identical.

In the embodiment shown, the source of PMOS transistor T3 is coupled to the voltage Vcp (at node 2) while the drain of T3 is coupled to the source of PMOS transistor T4. Also, the drain of PMOS transistor T4 is coupled to the drain of NMOS transistor T5 at driver output node 10. The source of NMOS transistor T5 is coupled to the drain of NMOS transistor T6 while the source of transistor T6 is coupled to node 0 which is at ground. (It is noted that in an alternate embodiment of the invention, it is conceivable that the source of T6 may be coupled to a voltage that is different from the ground voltage. This alternate voltage would preferably be lower than both Vcp and Vcc). The gate of T4 is coupled to the gate of T5. The gates of both T4 and T5 are coupled to the power supply voltage Vcc (at node 1) The PMOS transistors T3, T4 and the NMOS transistor T5, T6 preferably form a CMOS amplifier.

The embodiment of the driver circuit shown in FIG. 4 further includes the PMOS transistors T1 and T2 as well as the diode T8 (where diode T8 is an NMOS transistor connected as a two-terminal device). NMOS transistors T1 and T2 are coupled in series. In the embodiment of FIG. 4, T1 is serially coupled to T2 at node 5. More specifically, the source of T1 is coupled to Vcp (at node 2) while the drain of T1 is coupled to the source of T2 at node 5. Node 5 is also coupled to the gate of T3. The embodiment of the driver circuit shown in FIG. 4 further includes the PMOS transistor T7 that selectively couples the voltage Vcc to the driver output node 10. In the particular embodiment shown, the transistor T7 selectively couples the voltage Vcc to the driver output node 10 through the current path of NMOS transistor T9 (T9 being serially coupled to T7). As shown, the body (i.e., the N-type substrate of the p-channel transistors T1, T2, T3, T4 and T7) are preferably tied to Vcp to assure neither the source or drain are forward biased. The diode T8 isolates node 2 from node 1 so that node 2 may be driven to a voltage Vcp that is higher than the voltage Vcc. The diode T8 also prevents node 2 being too far below Vcc when no external voltage is applied to node 2 (in this case, node 2 will be one diode voltage drop below that of Vcc).

The driver circuit preferably includes a logic portion that controls the operation of the transistors T1 through T7. The logic portion includes the NOR gates L1 and L7, INVERTER gates L2 and L6 as well as NAND gates L3, L4 and L5. As shown, the output of the NAND gate L3 is coupled to the drain of T2, the output of NAND gate L4 is coupled to the gate of T6, and the output of NAND gate L5 is coupled to the gate of T7.

The logic gates L1 through L7 are powered by the power supply voltage Vcc and are coupled to Vcc and ground (connections not shown). The logic portion of the driver circuitry has a Read input coupled to node 11 and a Standby input coupled to node 12. Preferably the output of a row or column decoder is coupled to the logic portion of the driver circuitry at node 13 (so that the output of the decoder is provided as an input to the NAND gates L3, L4 and L5). As will be explained, the values of Read and Standby as well as the decoder output control the operation of the transistors T1 through T7, thereby determining the voltage at the driver output node 10.

As noted above, the programmable resistance memory element will need sufficient current in order to program the memory element (for example, to RESET and SET the memory element) Likewise, the programmable resistance memory cell may need sufficient current for forming the memory element initially. The column line and/or row line needs to be switched to a voltage which is sufficient to provide the necessary currents. The voltage necessary for driving a row or a column line may be higher than the Vcc voltage provided by the power supply. A voltage higher than Vcc for driving the column line and/or row line can be provided by the driver circuit of FIG. 4 by way of the voltage Vcp. Preferably, Vcp is greater than Vcc (i.e., Vcp>Vcc). More preferably, Vcp is greater than Vcc and also less than or equal to 2 Vcc (i.e., Vcc<Vcp≦2Vcc). With Vcp between Vcc and 2 Vcc, the driver output node 10 may be driven to a voltage between 0 and 2 Vcc (that is, the output node may be driven to a voltage Vout such that 0≦Vout≦2 Vcc).

With Vcp between Vcc and 2 Vcc, the design of the driver circuit shown in FIG. 4 provides that the magnitude of the voltage difference from drain to source, gate to drain, or gate to source across any of the transistors T1 through T9 preferably remains less than or equal to the power supply voltage Vcc (where "magnitude" is the absolute value) Hence, while the driver output node 10 may be driven to a voltage Vcp that is higher than Vcc, the magnitude of the voltages across the drain to source, gate to drain, or gate to source terminals of the transistors T1 through T9 preferably remains less than or equal to the magnitude of the power supply voltage Vcc. The transistors T1 through T9 thus do not need to accommodate the higher voltage Vcp, and the PMOS and NMOS transistors used in the circuit may be transistors designed for use with a conventional power supply voltage Vcc. As noted above the logic gate L1 through L7 may also be powered by the same power supply voltage Vcc.

Alternate embodiments of the invention are possible that can accommodate a voltage Vcp at node 2 that is higher than 2 Vcc, thereby allowing the driver output node 10 to be driven to a voltage Vcp that is higher than 2 Vcc. For example, it is possible that Vcp may be made 3 Vcc, 4 Vcc or higher so that the driver output voltages up to 3 Vcc, up to 4 Vcc or even higher are possible. For example, it is possible that the circuitry shown in FIG. 4 be modified by adding one or more additional PMOS transistors in combination with T3 and T4. For example, one or more additional PMOS transistors may be coupled in series with T3 and T4. As well as one or more additional PMOS transistors may be placed in combination with T1 and T2. For example, one or more additional PMOS transistors may be coupled in series with T1 and T2. In addition it may also be conceivable that in alternate embodiments of the invention one may wish to add one or more additional NMOS transistors in combination with (such as in series with) the NMOS transistors T5 and T6. Of course, many alternate designs are possible. Hence, the circuit shown in FIG. 4 may be modified so that the voltage Vcp may be any voltage greater than Vcc while the magnitude of the voltage across the terminals of the MOS transistors used in the driver circuitry (that is the magnitude of the voltage across gate and source, gate and drain, and drain and source) would still be less than or equal to Vcc.

In the embodiment of the driver circuit shown in FIG. 4, node 2 is isolated from node 1 by the diode T8. This permits the voltage Vcp at node 2 to be driven higher than the voltage Vcc at node 1. Vcp can be supplied to node 2 in different ways. For example, Vcp can be supplied externally such as through the pad of the chip (such as at probe). Using an external Vcp voltage allows high speed forming to be done at probe (the speed of such forming may be improved since an externally supplied voltage may allow for higher programming currents than that which is available from an on-chip charge pump due to size and cost limitations on the size of the capacitors placed on the charge pump).

Alternately, Vcp may be supplied by an on-chip charge pump. An example of an on-chip charge pump is the DC-to-DC converter shown in FIG. 5. A charge pump is useful for furnishing a voltage Vcp higher than Vcc that may be needed by the chip during normal programming operations. For example, during normal programmable operations it is possible that a write operation will be followed by a read operation that checks the success of the write operation. If the read shows that the write operation was not successful then the write may be repeated using the higher voltage Vcp that may be supplied by the charge pump. It is noted that if the charge pump is off and no external Vcp is provided at node 2, then (because of diode T8) the voltage at node 2 is one diode below Vcc.

In the circuit shown in FIG. 4, driver output node 10 may be switched to the desired voltage of Vcc or Vcp by applying the appropriate input conditions to the Read (node 11) and Standby (node 12) inputs. The Read and Standby inputs may be "high" or "low" where "high" is preferably Vcc and "low" is preferably ground. The driver output node 10 may be brought to the higher voltage Vcp (possibly needed during a write or forming operation) by bringing both the Read and Standby inputs (nodes 11 and 12, respectively) low. Bringing Read and Standby both low, brings nodes 4 and 9 high, and brings node 15 low. Assuming that the output from the decoder at node 13 is high, then the output of gate L3 at node 6 and the output of gate L4 at node 7 are both brought low while the output of gate L5 at node 8 is brought high.

Bringing the output of NAND gate L3 low pulls down the drain of T2. Pulling down the drain of T2 thereby pulls down the drain of T1. Preferably, the drain of T1, and hence the gate of T3, goes to a voltage which is slightly above Vcc+|Vt| (p-channel). This turns on T3, which drives the driver output node 10 through PMOS transistor T4 thereby coupling the output node 10 to the higher voltage Vcp. As noted, Vcp may be supplied by the DC-to-DC converter shown in FIG. 5 which is turned on by allowing it to cycle. In one embodiment, it is preferable that T1 should be smaller by at least 3:1 than T2 to provide a small enough voltage at the gate of T3 to assure T3 is on when the output of logic gate L3 is brought logically low. T2 and T4 assure that the drains of T1 and T3 do not go below Vcc, assuring that the magnitude of the voltages across the transistors T1 through T4 is always less than Vcc (T2 and T4 turn off when the source of either goes below Vcc+|Vt| p-channel). This limits the magnitude of the voltage across the transistors T1 through T4 to that conventionally seen by logic and transistors used with a power supply voltage Vcc.

Referring to FIG. 4, in an alternate embodiment of the invention, an additional NMOS transistor may be coupled between the output of NAND gate L3 and the drain of PMOS transistor T2. The drain of the additional NMOS transistor would be coupled to the drain of PMOS transistor T2, the source of the additional NMOS transistor would be coupled to the output of NAND gate L3, and the gate of the additional NMOS transistor would be coupled to Vcc. The additional NMOS transistor may improve the voltage protection of the output driver in the NAND gate L3.

As noted above, with both Read and Standby low, the node 9 is high so that the output of NAND gate L4, and hence the gate of T6 is also low. This turns transistor T6 off, so that the driver output is electrically disconnected from the ground node 0. Likewise, with both Read and Standby low, the output of NOR gate L7 at node 15 is also low making the output of NAND gate L5 (at node 8) high so that transistor T7 is also turned off. It is noted that the NMOS transistor T9 is preferably added to the driver circuit shown in FIG. 4. The NMOS transistor T9 isolates transistor T7 from the high voltages on the driver output node 10 during the write and/or forming operations. In the embodiment shown, it is preferable that the drain of transistor T9 is coupled to the drain of T7, the source of T9 is coupled to the driver output node 10, and the gate of T9 is coupled to Vcc.

During a read operation the columns and/or rows may not need the higher voltage Vcp and the lower voltage Vcc may be sufficient. Therefore, for a read operation, the driver output node 10 may be driven near the voltage Vcc by transistor T7 which selectively couples the driver output 10 to Vcc through the current path of transistor T9 thereby providing the drive to the column lines and/or row lines from Vcc instead of Vcp. (The actual voltage at the output node 10 may be below Vcc by the threshold voltage Vt). Driving through T7 may be advantageous for reducing the current drain from Vcp when Vcp is generated by an on-chip DC-to-DC converter.

In the embodiment shown, the PMOS transistor T7 selectively couples the driver output node 10 to the voltage Vcc through the current path of the transistor T9. In alternate embodiments of the invention it may be possible to replace T7 with an NMOS transistor or a combination of NMOS and PMOS transistors.

In another embodiment of the invention the driver output node 10 may be initially driven from ground to Vcc through a pullup connected to Vcc (such as transistor T7). The output node 10 may then be driven to Vcp by turning off T7 and turning on transistors T3 and T4.

In yet another embodiment of the invention it may be possible to eliminate T7 (along with transistor T9 and logic gates L5, L6 and L7) such that the charging to the voltage Vcc may be through separate drive circuitry. For example, in one embodiment, circuitry may be designed such that initial charging from ground to Vcc is through separate drive circuitry which is turned off before transistor T3 is turned on to complete the charging of the output driver node 10 above Vcc. Alternately, for a read operation, the driver output node 10 may be forced to Vcc directly so that drive is directly from Vcc. In this case, the charge pump can be turned off and the currents needed for selection be done more efficiently at reduced power.

It is noted that during a read operation, the Read input at node 11 will be high while the Standby input at node 12 will be low. In this case the output of L7 will be high and the output of NAND gate L5 will be low so that transistor T7 will be on, thereby coupling the driver output node 10 to Vcc through the current path of T9. Also, with Read high and Standby low, the output of NOR gate L1 will be low bringing the output of logic NAND gate L3 high. This brings the drain of T2 high, thereby driving the source of T2, and, hence, the gate of T3 to about Vcp. This turns off T3 and electrical disconnects Vcp (node 2) from the driver output node 10. Likewise, with Read high and Standby low, the output of NAND gate L4 will be low so that transistor T6 is turned off and the driver output node 10 is electrical disconnected from ground.

With the Standby input high (regardless of the state of the Read input), the outputs of NAND gates L3 and L5 are both high, and transistors T3 and T7 are both off so that the driver output is electrically disconnected from both Vcp (node 2) and Vcc (node 1). With Standby high, the output of NAND gate L4 is also high thereby turning on transistor T6 and coupling the driver output node 10 to ground. It is noted that T5 assures that the drain of T6 does not see more voltage than Vcc. T5 turns off when the drain of T6 (the source of T5) goes above Vcc−Vt (n-channel).

It is further noted that the logic circuit comprising gates L1 and L7 is simply one embodiment of a circuit for carrying out the logic for controlling the operation of transistors T1 through T7. Other designs are, of course, possible. Any logic circuit that can appropriately control the operation of the transistors T1 through T7 so that the appropriate voltage is applied at the driver output node 10 during the programming and/or forming of the programmable resistance memory devices is within the spirit and scope of this invention.

The driver circuitry shown in FIG. 4 allows for a driver output 10 that can swing from 0 to Vcp (a voltage which is preferably up to twice that of Vcc). However, magnitude of the voltage difference from gate to source, gate to drain, or drain to source of the transistors T1 through T9 will be no greater than if the maximum voltage on the chip is Vcc. Hence, as noted, the driver circuitry permits the use of conventional transistors designed to tolerate voltages in the range of 0 to Vcc.

Figure 5:
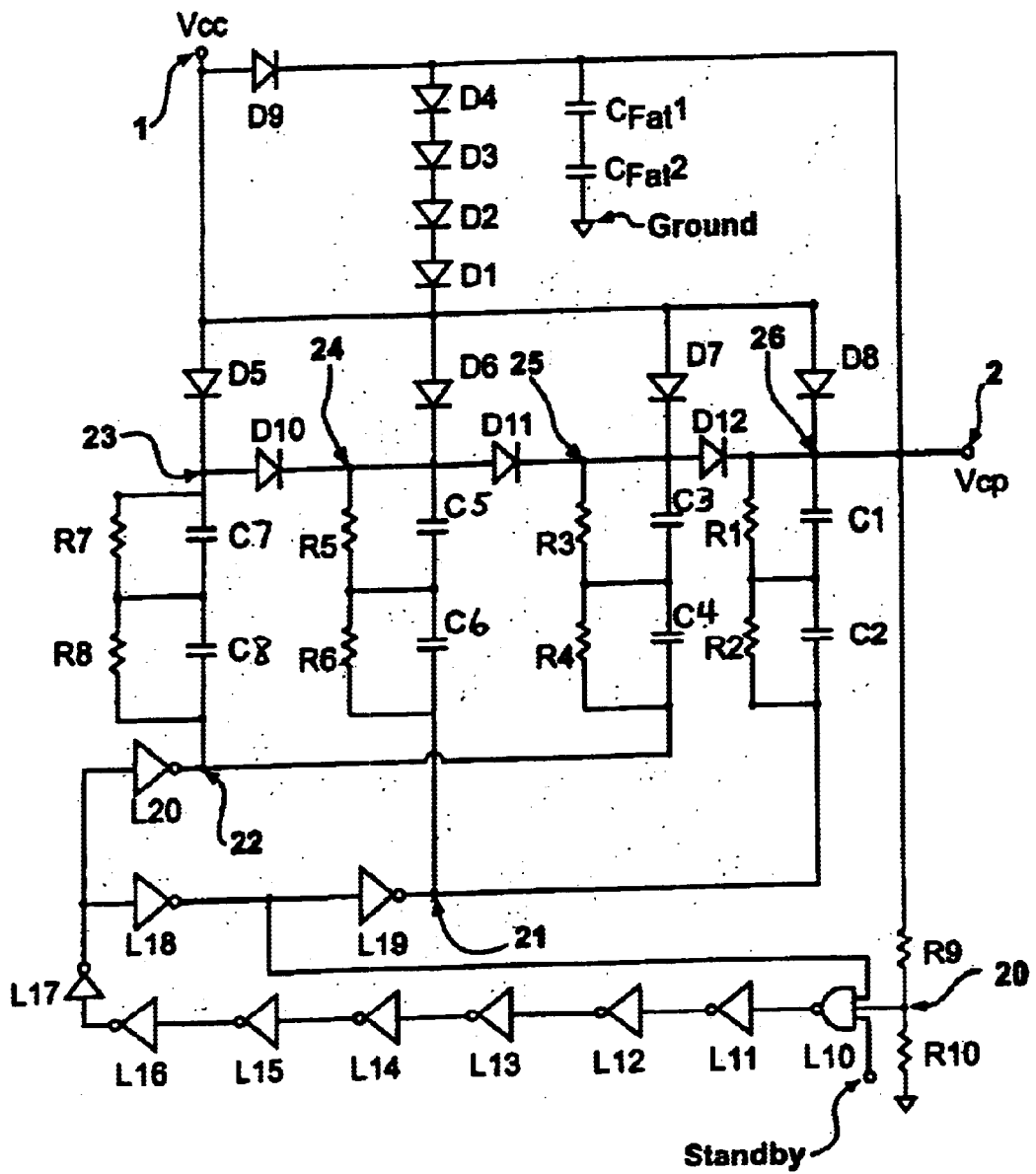
FIG. 5 is a schematic diagram of an embodiment of a DC-to-DC converter.

FIG. 5 shows an embodiment of a charge pump like that conventionally used as an on-chip DC-to-DC converter. The charge pump includes diodes D1 through D12, resistors R1 through R8, capacitors C1 through C8, NAND gate L10 and logic inverters L11 through L20. D1, D2, D3 and D4 are used to clamp Vcp so it is no more than twice Vcc (2×Vcc). The capacitors, if made out of active NMOS transistors, should preferably be made two in series with parallel resistors around the capacitors to insure that the mid-point of the capacitors is half the voltage across a pair of capacitors (for example, in the embodiment shown the resistors R1 and R2 are placed across C1 and C2, the resistors R3 and R4 are placed across C3 and C4, etc). Resistor R9 may be made with an NMOS transistor where the positive side is a gate-drain short, and the negative side is the source. The ring oscillator comprising logic inverters L11 through L17 is preferably adjusted to achieve a frequency in the range of about 50–100 MHz, or a frequency that efficiently transfers charge into C1 and C2, and out of C1 and C2 into Cfat1 and Cfat2, so that the voltage Vcp is adequate to serve the circuit needs. Once, Vcp reaches a voltage adequate so that the voltage at the node 20 between R9 and R10 exceeds input threshold of L10, the oscillator will slow, down to save power. Preferably, this should happen before the diodes D1 through D4 clamp Vcp. As nodes 21 and 22 are oscillating, the charge from the diodes D5 through D8 transfer charge into capacitors C1 and C2. The combined series capacitance of Cfat1 and Cfat2 (also referred to as Cfat1/Cfat2) across node 2 to ground, is preferably made large enough to support the programming pulse to form or reset a device. In one embodiment, Cfat1/Cfat2 may have a combined series capacitance of about 4 uF (microfarads) to avoid 0.25 degradation in the Vcp. Then before programming again, the charge pump is preferably allowed to restore Vcp. In one embodiment, it is possible that Cfat1/Cfat2 may need to be no larger than 0.001 μF (microfarads) if used only for field use on reset at currents under 3 ma for less than 100 nsec.

Figure 6:
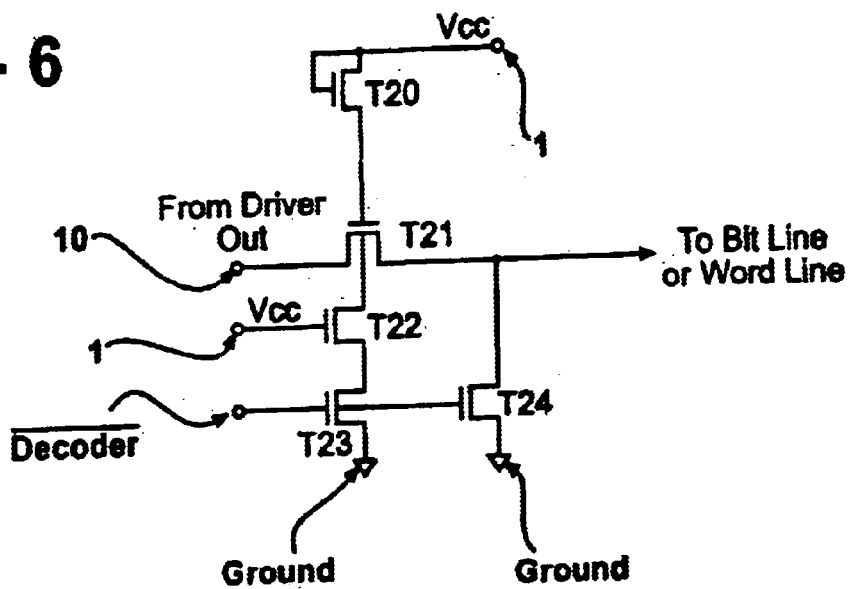
FIG. 6 is a schematic diagram of an embodiment of a decoded switch circuit.
Figure 7:
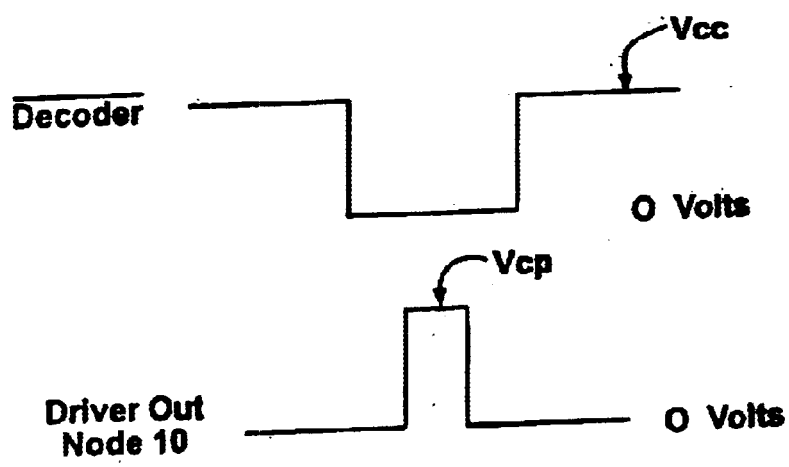
FIG. 7 is a timing diagram showing the decoder input signal and the signal from the driver circuit of FIG. 4 as they are applied to the decoded switch circuit of FIG. 6.

It is noted that in one embodiment of the present invention the driver output node 10 shown in FIG. 4 may be directly coupled to each column and/or row line of the programmable resistance memory array. Alternately, the output driver node 10 can be used to drive the selected row or column through a switched pass gate controlled by the decoder to each decoded row or column. An example of such a gate circuit is the decoded switch circuit shown in FIG. 6 comprising NMOS transistors T20 through T24. As shown in FIG. 6, inputs to the switch circuit include the driver output signal of node 10 of FIG. 4, the Vcc signal of node 1 of FIG. 4, and the inverted decoder signal. FIG. 7 shows the inverted decoder signal and the signal from the driver output node 10. As shown in FIG. 7, the dcccdzr input inverted decoder signal should preferably arrive before and terminate after the signal from the driver output node 10.

Referring again to FIG. 4, it is conceivable, that in an alternate embodiment of the invention the circuit shown in FIG. 4 may be modified so that the voltage applied at node 1 and the voltage applied at node 2 are negative voltages (for example, it is possible that Vcp may be applied to node 2 and Vcc may be applied to node 1 as negative voltages relative to a ground voltage). In this case it is preferable that the magnitude (i.e. absolute value) of the voltage applied at node 2 is greater than the magnitude of the voltage applied at node 1 (that is $|V_{node2}|>|V_{node1}|$). It is more preferable that the magnitude of the voltage applied at node 2 is less than or equal to twice the magnitude of the voltage applied at node 1 (that is $|V_{node2}| \leq 2|V_{node1}|$). The driver circuit would preferably be adapted so that the magnitude of the output voltage Vout at the output node would have a range of values which would be greater than 0 and less than or equal to the magnitude of the voltage at node 2 (that is, $0 \leq |Vout| \leq |V_{node2}|$). The driver circuit would preferably also be adapted so that the magnitude of the voltages across the terminals of the MOS transistors of the circuit would be less than or equal to the magnitude of the voltage applied at node 1.

As noted, the present invention is directed to programmable resistance memory elements comprising a programmable resistance material. The programmable resistance material may be programmed to at least first resistance state and a second resistance state. The programmable resistance material is preferably programmed by electrical signals (such as currents). In one embodiment, the memory material is programmable to two resistance states so that each of the memory elements is capable of storing a single bit of information. In another embodiment, the memory material is programmable to at least three resistance states so that each of the memory elements is capable of storing more than one bit of information. In yet another embodiment, the memory material is programmable to at least four resistance states so that each of the memory elements is capable of storing at least two bits of information. Hence, the memory materials may have a range of resistance values providing for the gray scale storage of multiple bits of information.

The programmable resistance materials may be directly overwritable so that they can be programmed from any of their resistance states to any other of their resistance states without first having to be set to a starting state. Preferably, the same programming pulse or pulses may be used to program the memory material to a specific resistance state regardless of its previous resistance state. (For example, the same current pulse or pulses may be used to program the material to its high resistance state regardless of its previous state). An example of a method of programming the memory element is provided in U.S. Pat. No. 6,075,719, the disclosure of which is incorporated by reference herein.

The memory material may be a phase change material. The phase-change materials may be any phase change memory material known in the art. Preferably, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

The memory material may include at least one transition metal element. The term "transition metal" as used herein includes elements 21 to 30, 39 to 48, 57 and 72 to 80. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

A first example of an elementally modified memory material is a phase-change memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. Preferably, the transition metal may include Cr, Fe, Ni, Nb, Pd, Pt and mixtures or alloys thereof.

A second example of an elementally modified memory material is a phase-change memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. Preferably, the transition metal may include Cr, Fe, Ni, Pd, Pt, Nb, and mixtures or alloys thereof.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A memory system, comprising:
   a programmable resistance memory cell coupled to a column line and a row line; and
   a driver circuit having an output node for outputting an output voltage to the column line or the row line, the driver circuit comprising:
   a plurality of PMOS transistors coupled in series between said output node and a first node of said driver circuit, and
   a plurality of NMOS transistors coupled is series between said output node and a second node of said driver circuit.

2. The memory system of claim 1, further comprising a control circuit including a first additional PMOS transistor coupled in series with a second additional PMOS transistor, said control circuit outputting a control voltage to a gate at least one of said plurality of PMOS transistors.

3. The memory system of claim 1, wherein said first additional PMOS transistor is coupled to said second additional PMOS transistor at a connection point, said connection point coupled to said gate, said control voltage outputted from said connection point.

4. The memory system of claim 1, wherein said first node is supplied with a first voltage and said second node is supplied with a ground voltage.

5. The memory system of claim 4, further comprising a switching circuit selectively coupling a second voltage to said output node.

6. The memory system of claim 5, wherein said first voltage is greater than a power supply voltage.

7. The memory system of claim 5, further comprising a logic circuit, said logic circuit adapted to couple said first voltage to said output node when a first set of input values are applied to said logic circuit, said logic circuit adapted to couple said second voltage to said output node when a second set of input values are applied to said logic circuit, said logic circuit adapted to couple said ground voltage to said output node when a third set of input values are applied to said logic circuit.

8. The memory system of claim 4, wherein said plurality of PMOS transistors includes a first and a second PMOS transistor, said plurality of NMOS transistors includes a first and a second NMOS transistor, a source of said first PMOS transistor being coupled to said first node, a drain of said first PMOS transistor being coupled to a source of said second PMOS transistor, a drain of said second PMOS transistor being coupled to a drain of said first NMOS transistor at said output node, a source of first NMOS transistor being coupled to a drain of said second NMOS transistor, a source of said second NMOS transistor being coupled to said second node.

9. The memory system of claim 8, wherein a gate of said second PMOS transistor and a gate of said first NMOS transistor are coupled to a second voltage.

10. The memory system of claim 9, further comprising a third PMOS transistor and a fourth PMOS transistor coupled in series at a connection point, said connection point coupled to a gate of said first PMOS transistor.

11. The memory system of claim 10, wherein a gate of said third PMOS transistor and a gate of said fourth PMOS transistor are coupled to said second voltage.

12. The memory system of claim 9, wherein said second voltage is a power supply voltage.

13. The memory system of claim 12, wherein said first voltage is greater than said power supply voltage.

14. The memory system of claim 13, wherein said first voltage is less than or equal to said power supply voltage multiplied by two.

15. The memory system of claim 9, further comprising a switching circuit selectively coupling said second voltage to said output node.

16. The memory system of claim 15, wherein said switching circuit comprises a fifth PMOS transistor coupled in series with a third NMOS transistor.

17. The memory system of claim 16, wherein a source of said fifth PMOS transistor is coupled to said first node, a drain of said fifth PMOS transistor is coupled to a drain of said third NMOS transistor, a source of said third NMOS transistor is coupled to said output node.

18. The memory system of claim 7, wherein an output from a row or column decoder circuit is an input to said logic circuit.

19. The memory system of claim 1, wherein the programmable resistance memory cell comprises a phase change material.

20. The memory system of claim 1, wherein said driver circuit is adapted so that the maximum magnitude of said output voltage is greater than the maximum magnitude of the voltage across the drain and source of each of said NMOS transistors and each of said PMOS transistors.

21. A memory system, comprising:
a programmable resistance memory cell coupled to a column line and a row line; and
a driver circuit having an output node for outputting an output voltage to the column line or the row line, the driver circuit comprising:
a plurality of PMOS transistors coupled in series, and
a plurality of NMOS transistors coupled is series, said plurality of PMOS transistors being coupled in series with said plurality of NMOS at said output node.

22. The memory system of claim 21, further comprising a control circuit including a first additional PMOS transistor coupled in series with a second additional PMOS transistor, said control circuit outputting a control voltage to a gate at least one of said plurality of PMOS transistors.

23. The memory system of claim 21, wherein said first additional PMOS transistor is coupled to said second additional PMOS transistor at a connection point, said connection point coupled to said gate, said control voltage outputted from said connection point.

24. The memory system of claim 21, wherein said plurality of PMOS transistors is coupled between a first node supplied with a first voltage and said second node is supplied with a ground voltage.

25. The memory system of claim 24, further comprising a switching circuit selectively coupling a second voltage to said output node.

26. The memory system of claim 25, wherein said second voltage is a power supply voltage, said first voltage being greater than said power supply voltage.

27. The memory system of claim 25, further comprising a logic circuit, said logic circuit adapted to couple said first voltage to said output node when a first set of input values are applied to said logic circuit, said logic circuit adapted to couple said second voltage to said output node when a second set of input values are applied to said logic circuit, said logic circuit adapted to couple said ground voltage to said output node when a third set of input values are applied to said logic circuit.

28. The memory system of claim 25, wherein said plurality of PMOS transistors includes a first and a second PMOS transistor, said plurality of NMOS transistors includes a first and a second NMOS transistor, a source of said first PMOS transistor being coupled to said first node, a drain of said first PMOS transistor being coupled to a source of said second PMOS transistor, a drain of said second PMOS transistor being coupled to a drain of said first NMOS transistor at said output node, a source of first NMOS transistor being coupled to a drain of said second NMOS transistor, a source of said second NMOS transistor being coupled to said second node.

29. The memory system of claim 28, wherein a gate of said second PMOS transistor and a gate of said first NMOS transistor are coupled to a second voltage.

30. The memory system of claim 29, further comprising a third PMOS transistor and a fourth PMOS transistor coupled in series at a connection point, said connection point coupled to a gate of said first PMOS transistor.

31. The memory system of claim 30, wherein a gate of said third PMOS transistor and a gate of said fourth PMOS transistor are coupled to said second voltage.

32. The memory system of claim 29, wherein said second voltage is a power supply voltage.

33. The memory system of claim 32, wherein said first voltage is greater than said power supply voltage.

34. The memory system of claim 33, wherein said first voltage is less than or equal to said power supply voltage multiplied by two.

35. The memory system of claim 29, further comprising a switching circuit selectively coupling said second voltage to said output node.

36. The memory system of claim 35, wherein said switching circuit comprises a fifth PMOS transistor coupled in series with a third NMOS transistor.

37. The memory system of claim 36, wherein a source of said fifth PMOS transistor is coupled to said first node, a drain of said fifth PMOS transistor is coupled to a drain of said third NMOS transistor, a source of said third NMOS transistor is coupled to said output node.

38. The memory system of claim 27, wherein an output from a or column decoder circuit is an input to said logic circuit.

39. The memory system of claim 21, wherein the programmable resistance memory cell comprises a phase change material.

40. A memory system, comprising:
a programmable resistance memory cell coupled to a column line and a row line; and
a driver circuit having at least two MOS transistors of the same type coupled in series between a first node and an output node, said driver circuit outputting an output voltage from said output node to the column line or the row line, said driver circuit adapted so that the maximum magnitude of said output voltage is greater than the maximum magnitude of the voltage across the drain and source of each of said at least two MOS transistors.

41. The memory system of claim 21, wherein said driver circuit is adapted so that the maximum magnitude of said output voltage is greater than the maximum magnitude of the voltage across the drain and source of each of said NMOS transistors and each of said PMOS transistors.

42. The memory system of claim 40, wherein said at least two MOS transistors are PMOS transistors.

43. The memory system of claim 40, wherein said at least two MOS transistors are NMOS transistors.

44. The memory system of claim 40, wherein said programmable resistance material includes a phase-change material.

45. The memory system of claim 40, wherein said programmable resistance material includes at least one chalcogen element.

* * * * *